United States Patent
Romano (10) Patent No.: US 6,861,891 B2
(45) Date of Patent: Mar. 1, 2005

(54) SUB-HARMONIC MIXER (75) Inventor: Antonio Romano, Ashton (CA)

(73) Assignee: Dragonwave, Inc., Kanata (CA)

( * ) Notice: Subject to any disclaimer, the term of this patent is extended or adjusted under 35 U.S.C. 154(b) by 0 days.

(21) Appl. No.: 10/720,331

(22) Filed: Nov. 25, 2003

(65) Prior Publication Data
US 2004/0104758 A1 Jun. 3, 2004

Related U.S. Application Data
(60) Provisional application No. 60/428,684, filed on Nov. 25, 2002.

(51) Int. Cl.[7] .............................................. G06G 7/12
(52) U.S. Cl. ...................................... 327/355; 327/356
(58) Field of Search ................................ 327/355, 356, 327/357, 359, 113, 119; 455/333

(56) References Cited

U.S. PATENT DOCUMENTS

| | | | | |
|---|---|---|---|---|
| 4,403,156 A | * | 9/1983 | Sakamoto | 327/113 |
| 5,767,726 A | * | 6/1998 | Wang | 327/356 |
| 5,809,410 A | * | 9/1998 | Stuebing et al. | 455/333 |
| 5,826,183 A | * | 10/1998 | Apel | 455/326 |
| 6,664,824 B2 | * | 12/2003 | Laws | 327/122 |

* cited by examiner

Primary Examiner—Tuan T. Lam (57) ABSTRACT

A sub-harmonic mixer comprises two field effect transistors in which the sources of the transistors are connected together and the drains of the transistors are connected together. The mixer includes signal generating means for generating a local oscillator (LO) signal coupled to the gate of one of the FETs. Circuit means is provided for maintaining the potential of the gate of the other FET at a substantially constant value relative to the local oscillator signal applied to the gate of the driven FET, and the FET's are arranged to permit the local oscillator signal applied to gate of the driven FET to drive a voltage across the gate-source of both FET's. An input and output port is coupled to the drains for receiving input signals for the mixer and outputting output signals from the mixer.

17 Claims, 4 Drawing Sheets

SUB-HARMONIC MIXER

CROSS REFERENCE TO RELATED APPLICATIONS

This application is a Non-Provisional application claiming priority from U.S. Provisional Application No. 60/428,684 filed Nov. 25, 2002.

FIELD OF THE INVENTION

The present invention relates to mixers for wireless receivers and transmitters, and in particular to sub-harmonic mixers.

BACKGROUND OF THE INVENTION

Receiver circuits for millimeter wave wireless communication systems typically include a low noise amplifier (LNA) and a down-converter for converting the received, high frequency signal to a lower, intermediate frequency (IF) signal, from which the baseband signal is subsequently extracted. Monolithic microwave integrated circuit (MMIC) fabrication technology enables the low noise amplifier and down-converter mixer circuits to be formed on a single integrated circuit chip, in order to improve performance, simplify production and reduce costs. For relatively low microwave carrier frequencies, the down-converter may employ a fundamental mixer, in which the same frequency generated by the local oscillator (LO) is mixed with the received RF signal to generate the intermediate frequency components. At low microwave frequencies, the local oscillator frequency is normally well separated from the RF frequency so that the LO signal can be readily isolated from the RF mixer port using standard filtering techniques. However, at higher microwave frequencies, the frequency of the local oscillator signal becomes geometrically closer to the RF carrier frequency in order to down-convert the RF frequency to a suitable intermediate frequency. This proximity of the local oscillator frequency to the RF frequency can lead to undesirable LO frequency radiation, and also isolation problems between the RF and LO mixer ports. Another drawback of using fundamental mixers in microwave frequency applications is that the local oscillators required to provide adequate output power at millimeter wave frequencies tend to be relatively bulky and expensive.

An alternative form of mixer which is employed in microwave frequency receivers is the sub-harmonic mixer, in which the injected mixer frequency which is mixed with the RF frequency is a multiple of the LO frequency generated by the local oscillator. This arrangement provides better frequency separation between the local oscillator and RF frequencies, thereby making it easier to prevent LO frequency signals leaking into the RF port and to prevent RF frequency signals passing to the LO port.

An example of a known sub-harmonic mixer comprises a pair of field effect transistors having interconnected drains and interconnected sources, and a 180° hybrid coupler having in-phase and anti-phase signal output ports coupled to a respective gate of the FET combination, and an input port for receiving a local oscillator signal. The RF and IF ports are coupled to the FET drains.

SUMMARY OF THE INVENTION

According to one aspect of the present invention, there is provided a mixer comprising first and second field effect transistors, each having a gate, a source and a drain, the source of the first field effect transistor being connected to the source of the second field effect transistor, and the drain of the first field effect transistor being connected to the drain of the second field effect transistor, input means coupled to one of the drains and the sources for receiving an input signal for the mixer, signal generating means for generating a local oscillator signal and coupled to the gate of the first field effect transistor, means for maintaining the potential of the gate of the second field effect transistor at a substantially constant value relative to the local oscillator signal applied to the gate of the first field effect transistor, the field effect transistors being arranged to permit the local oscillator signal applied to the gate of the first FET to drive a voltage across the gate-source of the first and second field effect transistors, and output means coupled to one of the drains and the sources for outputting an output signal from the mixer.

Advantageously, this arrangement provides a sub-harmonic mixer in which a local oscillator signal voltage across the gate-source of one FET and an anti-phase local oscillator signal voltage across the gate-source of the other FET are provided by driving a single gate and maintaining the potential of the other gate at a substantially constant value relative to that of the driven gate, thereby removing the need for a hybrid coupler which is used in conventional gate-fed sub-harmonic mixers to provide anti-phase local oscillator signals to the gates of the FET pair. Advantageously, removal of the hybrid coupler which occupies a substantial area of an MMIC mixer circuit simplifies the fabrication process and allows the area required for the mixer to be significantly reduced, thereby reducing costs. Furthermore, this arrangement allows the local oscillator to be coupled directly to one of the gates of the field effect transistors so that local oscillator power can be coupled more efficiently into the sub-harmonic mixer than previously possible due to the insertion loss associated with the use of a hybrid coupler in conventional mixers.

In one embodiment, the input means may be connected to the drains. In this embodiment, the sub-harmonic mixer may further comprise input signal coupling means for coupling the source of each of the first and second field effect transistors to ground at the frequency of the input signal. Preferably, the input signal coupling means is adapted to substantially isolate the sources of each of the first and second field effect transistors from ground at the frequency of the local oscillator signal. Alternatively, the input means may be connected to the sources and the input signal coupling means may be connected to the drains.

In one embodiment of the present invention, the output means may be connected to the drains. In this embodiment, the sub-harmonic mixer may further comprise output signal coupling means for coupling the source of each of the first and second field effect transistors to ground at the frequency of the output signal. Preferably, the output signal coupling means is adapted to substantially isolate the source of each of the first and second field effect transistors from ground at the frequency of the local oscillator signal. Alternatively, the output means may be connected to the sources, and the output signal coupling means may be connected to the drains.

In embodiments of the invention, the input and output means may be connected to the drains, or the input and output means may be connected to the sources or one of the input means and output means may be connected to the drains and the other to the sources.

Embodiments of the sub-harmonic mixer further comprise DC coupling means for coupling the source of each of the first and second transistors to DC ground. Preferably, the DC coupling means is adapted to substantially isolate the source of each of the first and second transistors from ground at the frequency of the local oscillator signal.

Embodiments of the present invention may further comprise circuit means coupled between the gate and source of at least one of the field effect transistors for matching the magnitude of the gate-source voltages applied across the first and second field effect transistors by the local oscillator signal. In one embodiment, the circuit means comprises capacitor means for passing a portion of the local oscillator signal between a gate and a source of a field effect transistor. The capacitor means may be provided by a capacitor and/or by a diode, for example a Shockley diode, for passing a portion of the local oscillator signal between a gate and a source of a field effect transistor.

Embodiments of the present invention may further comprise biasing means for biasing the gate of each of the first and second field effect transistors at a bias voltage such that each of the first and second field effect transistors operate in pinch-off mode.

Embodiments of the present invention may further comprise gate signal filter means for substantially preventing signals having frequencies of any of the local oscillator signal, the input signal and the output signal passing from a respective gate to the biasing means. In one embodiment, the gate signal filter means may comprise a choke coil, a resistor, or any other means, including a device or circuit, that isolates the DC bias from ac signals at the mixer.

Embodiments of the present invention may further comprise DC coupling means for coupling the drains of each of the first and second field effect transistors to DC ground. Preferably, embodiments of the present invention further comprise filter means for preventing the input signal and the output signal passing through the DC coupling means.

Embodiments of the sub-harmonic mixer may further comprise filter means connected to the drains (or sources) for selectively passing signals of a particular frequency or frequencies. In one embodiment, the filter means may include an RF filter for selectively passing desired RF frequencies which may either be received by the mixer as an input signal or generated by the mixer as an output signal.

In embodiments of the present invention, the RF filter means may be adapted to pass signals having a frequency selected from $f_{RF}=2nf_0 \pm f_{IF}$, where $f_{IF}$ is an intermediate frequency signal at the drains (or sources) of the mixer (either as an input signal to the mixer as an output signal from the mixer), $f_0$ is the local oscillator frequency, and n is a selected integer.

In one embodiment, the RF filter means may be adapted for passing an RF frequency or frequencies within a first frequency band which is above the frequency of the local oscillator signal, $f_0$.

In embodiments of the sub-harmonic mixer, the filter means may include a filter for passing signals having a selected intermediate frequency or frequencies (or a baseband signal), which may either be received by the mixer as an input signal or generated by the mixer as an output signal.

The filter may be adapted to pass a frequency selected from $f_{IF}=f_{RF}-2nf_0$ or $2nf_0-f_{RF}$, where $f_{RF}$ is the frequency of the RF signal input to the drains (or sources) of the mixer, $f_0$ is the frequency of the local oscillator signal, and n is a selected integer. In one embodiment, the filter may be adapted to pass signals having a selected frequency or frequencies below the frequency of the local oscillator signal, $f_0$.

According to another aspect of the present invention, there is provided a sub-harmonic mixer, comprising first and second field effect transistors, each having a gate, a drain and a source, the drain of the first field effect transistor being connected to the drain of the second field effect transistor and the source of the first field effect transistor being connected to the source of the second field effect transistor, input means coupled to the sources for receiving an input signal for the mixer, signal generating means for generating a local oscillator signal and coupled to the gate of the first field effect transistor, means for maintaining the potential of the gate of the second field effect transistor at a substantially constant value relative to the local oscillator signal applied to the gate of the first field effect transistor, the FETs being arranged to permit the local oscillator signal applied to the first gate to drive a voltage across the gate-drain of each of said first and second FETs, and output means coupled to the sources for outputting an output signal from the mixer.

Embodiments of this aspect of the invention may include any one or more of the features described above and arranged or reconfigured as required.

BRIEF DESCRIPTION OF THE DRAWINGS

Examples of embodiments of the invention will now be described with reference to the drawings, in which.

DETAILED DESCRIPTION OF THE EMBODIMENTS

Figure 1:
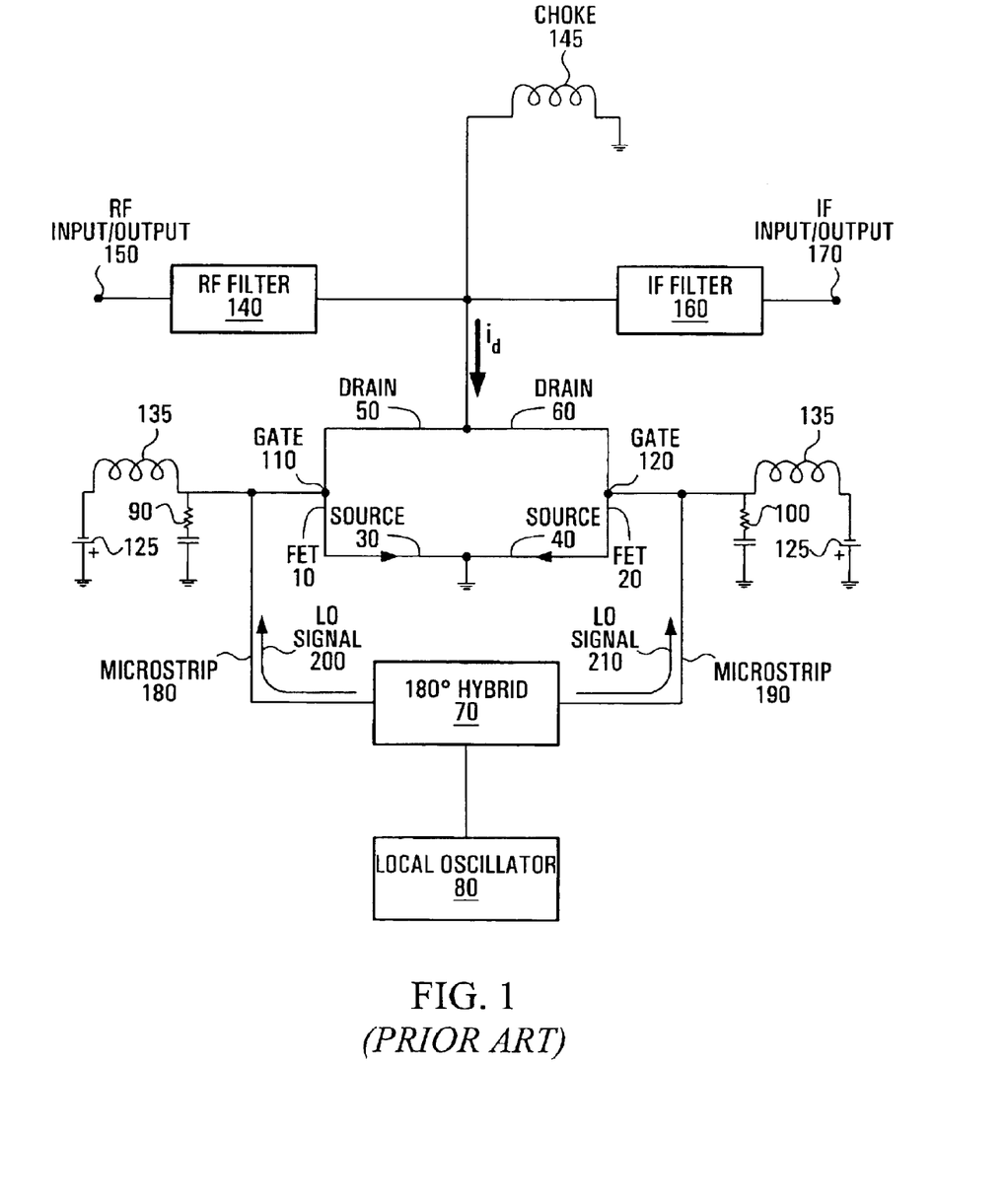
FIG. 1 is a circuit diagram of a conventional gate-driven sub-harmonic mixer.

Referring to FIG. 1, shown is a circuit diagram of a conventional gate-driven sub-harmonic mixer. A first FET (Field Effect Transistor) 10 and a second FET 20 each have a respective source 30, 40, a respective drain 50, 60 and a respective gate 110, 120. The drains 50, 60 are connected together, and the sources 30, 40 are connected together, and also to ground. A 180° hybrid 70 is connected to the gates 110, 120 of the FETs 10, 20, through a respective conducting microstrip 180, 190, and a local oscillator 80 is connected to the 180° hybrid 70. An ac grounded resistor 90, 100 is also connected to a respective gate 110, 120 of the FETs 10, 20. A choke 145 connects the drains 50, 60 of the FETs 10, 20 to DC ground. An RF filter 140 is connected between an RF input/output 150 and the drains 50, 60, and an IF (intermediate frequency) filter 160 is connected between an IF input/output 170 and the drains 50, 60.

A signal of frequency, $f_0$, is generated by the local oscillator 80 and split by the 180° hybrid 70 into two LO (Local Oscillator) signals 200, 210 that have a phase difference of approximately 180°, and each of the signals is applied to a respective gate 110, 120. The gate voltages applied by the LO signals modulate the source-drain resistances of the FETs 10, 20, and the 180° phase difference between the LO signals enables conduction through the combined FETs 10, 20 for both positive and negative portions of cycles of the signal generated by the local oscillator 80.

More specifically, the gates 110, 120, of the FETs 10, 20 are DC biased by a DC voltage source 125 through choke coils 135, to operate in "pinch-off", where source-drain resistance is high. In pinch-off, the source-drain current at a respective one of the drains 50, 60 of the FETs, 10, 20 is approximately proportional to the source-drain voltage, $V_{DS}$, across respective sources 30, 40 and drains 50, 60, and approximately proportional to the gate-source voltages, $V_{GS}$, across respective gates 110, 120 and sources 30, 40. In pinch-off, by applying gate-source voltages, $V_{GS}$, of frequency, $f_0$, to the FETs 10, 20, the source-drain resistance of each FET 10, 20 is modulated with frequency, $f_0$. However, since the gate voltage of one of the FETs 10, 20 is approximately 180° out of phase with the gate voltage of the other FET 10, 20, the gate-source voltages, $V_{GS}$, applied to the FETs 10, 20 are also approximately 180° out of phase with each other, and this results in the effective resistance or conductance of the combined FETs 10, 20 being modulated with a frequency $2f_0$. If the conduction characteristics of both FETS are the same, time varying conduction at the fundamental frequency LO and odd harmonics are suppressed or rejected so that the dominant mixer frequency is $2f_0$. In this case, the mixer operates as a sub-harmonic mixer, generating sum and difference frequencies of $f_{out}=2f_0 \pm f_{IN}$. In contrast, a fundamental mixer generates sum and difference frequencies of $f_{out}=f_0 \pm f_{IN}$.

In the case where an RF signal of frequency, $f_{RF}$, is input at the RF input/output 150, the RF signal drives a source-drain voltage, $V_{DS}$, of frequency, $f_{RF}$, across the sources 30, 40 and drains 50, 60 of the FETs 10, 20. The effective source-drain resistance of the combined FETs 10, 20 being modulated with frequency, $2f_0$, and the source-drain voltage, $V_{DS}$, having a frequency, $f_{RF}$, result in a current, $i_d$, at the drains 50, 60 of the FETs 10, 20 having frequency components $2f_0 \pm f_{RF}$ or $f_{RF} \pm 2f_0$.

The IF filter 160 is adapted to pass an IF signal having the frequency component $f_{RF}-2f_0$ and/or $2f_0-f_{RF}$ (depending on side band operation) to the IF input/output 170, while rejecting RF and LO frequencies, as well as other unwanted frequency components generated by the mixing process.

In the case where an IF signal, of frequency $f_{IF}$, is input at the IF input/output 170, the IF signal drives a source-drain voltage, $V_{DS}$, of frequency, $f_{IF}$, across the sources 30, 40 and drains 50, 60 of the FETs 10, 20. The effective source-drain resistance of the combined FETs 10, 20 being modulated with frequency, $2f_0$, and the source-drain voltage, $V_{DS}$, having a frequency, $f_{IF}$, result in a current, $i_d$, at the drains 50, 60 of the FETs 10, 20 having frequency components with frequencies, $2f_0 \pm f_{IF}$. The RF filter 140 is adapted to pass an RF signal having the selected frequency component to the RF input/output 150, while rejecting IF and LO frequencies as well as other unwanted frequency components generated by the mixing process.

The impedance of the microstrips 180, 190 is typically 50 Ω whereas the gate impedance of the FETs 10, 20 is typically much greater. The resistors 90, 100 are used to lower the gate impedance of the FETs 10, 20 to a value which allows an acceptable impedance match over the required LO bandwidth.

The 180° hybrid 70 constitutes a relatively large component of an MMIC mixer circuit and consumes a large amount of semi-conductor real-estate. The 180° hybrid 70 also introduces circuit losses, and therefore increased LO signal power is required in order to compensate for this insertion loss.

Figure 2:
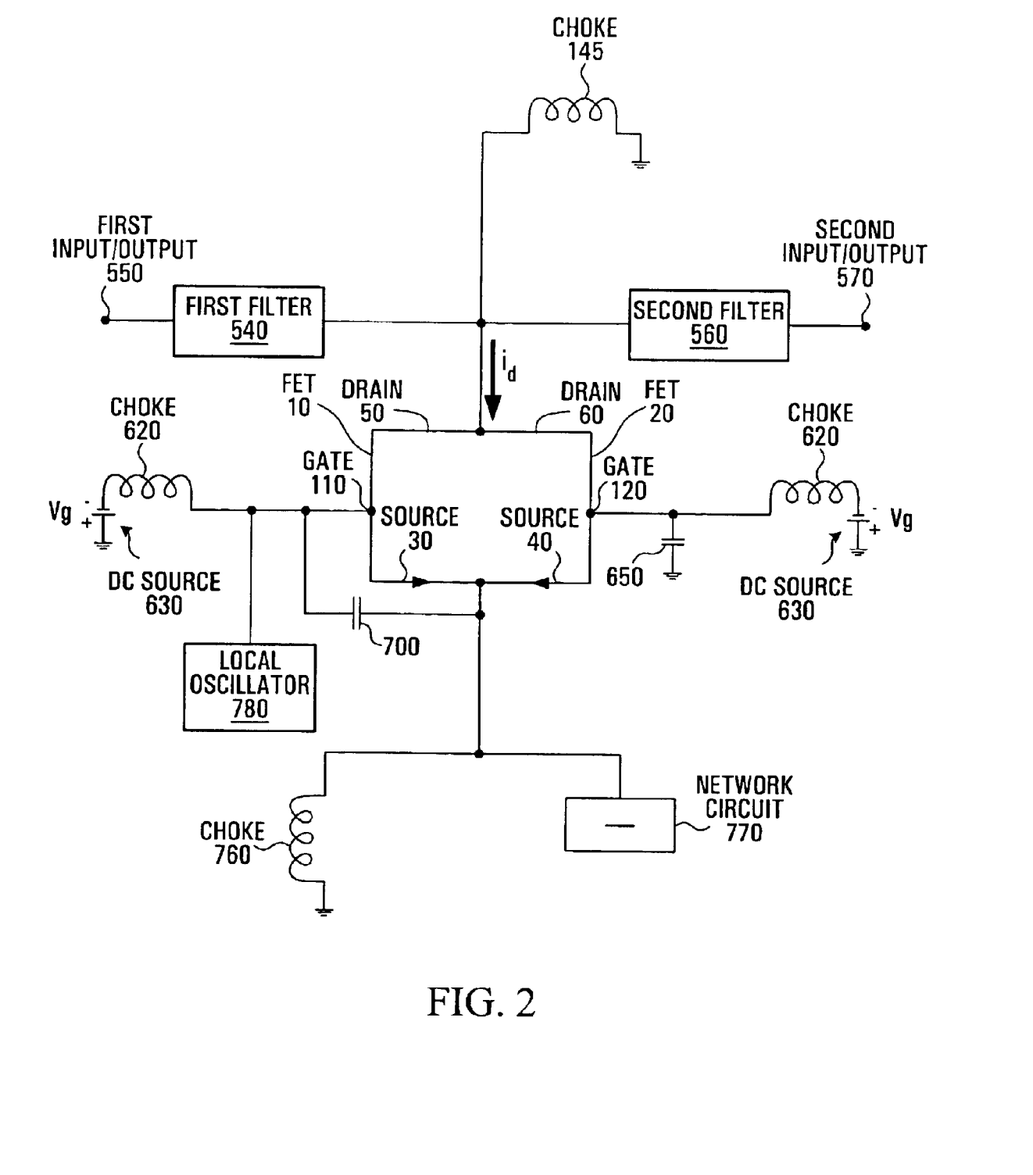
FIG. 2 is a circuit diagram of a sub-harmonic mixer, according to an embodiment of the invention.

Referring to FIG. 2, shown is a circuit diagram of a sub-harmonic mixer, according to an embodiment of the invention. First and second FETs 10, 20 each have respective drains 50, 60 connected to each other and respective sources 30, 40 also connected to each other. The sources 30, 40 are connected to DC ground through a choke 760. A network circuit 770 is also connected to the sources 30, 40 of the FETs 10, 20. Preferably, both the network circuit 770 and the choke coil 760 are adapted to substantially prevent leakage of LO frequency signals to ground. A DC source 630 is provided for applying DC biases, $V_g$, to each of the gates 110, 120 via a respective choke 620. A local oscillator 780 is connected to the gate 110 of the first FET 10. The gate 120 of the second FET 20 is connected to a grounded capacitor 650, which shorts both LO and RF frequency signals to ground. A capacitor 700 is connected between the source 30 and gate 110 of the first FET 10. The drains 50, 60 of the FETs 10, 20 are connected to DC ground via a choke 145.

A first filter 540 is connected between the drains 50, 60 of the FETs 10, 20 and a first input/output 550. A second filter 560 is connected between the drains 50, 60 of the FETs 10, 20 and a second input/output 570.

The sub-harmonic mixer of FIG. 2 is used to convert an input signal having a first frequency, $f_1$, to an output signal having a frequency which is different from $f_1$. The input signal is input at one of the input/output ports 550, 570 and the output signal is output at the other input/output port 550, 570. As such when one of the input/output ports 550, 570 serves as an input port for the input signal the other input/output port 550, 570 serves as an output port for the output signal. The input/output port at which the input signal is applied depends on the frequency, $f_1$. Two cases are discussed below. In the first case, the input signal is an RF signal of frequency $f_1=f_{RF}$ and the output signal is an IF signal of frequency $f_{1F}$. In the second case, the input signal is an IF signal of frequency $f_1=f_{1F}$ and the output signal is an RF signal of frequency $f_{RF}$. However, embodiments of the invention are not limited to these two cases and other signals may be used.

In operation, a DC bias voltage $V_g$ is applied to each gate 110, 120, such that the FETs operate in pinch-off mode. The local oscillator 780 generates a local oscillator (LO) signal of frequency, $f_0$, which provides a gate voltage, $V_{GG}$, at the gate 110 of the first FET 10. As mentioned above, the choke 760 and the network circuit 770 connected to the sources 30, 40 of the FETs each present a high impedance to LO frequency signals, and the capacitor 650 connected to the gate 120 of the second FET 20 shorts LO frequency signals to ground and therefore effectively maintains the second gate 120 at a constant potential (i.e. ground potential in this embodiment) relative to the first gate 110. The LO signal voltage, $V_{GG}$, is therefore dropped across and effectively divided between the gate 110 and the source 30 of the first FET and the source 40 and the gate 120 of the second FET. Thus, the LO signal applied to the gate 110 of the first FET 10 drives both a gate source voltage, $V_{GS+}$, of frequency, $f_0$, across the gate-source of the first FET, and a gate-source voltage, $V_{GS-}$, of frequency, $f_0$, across the gate-source of the second FET, and which has a phase difference of approximately (or exactly) 180 degrees relative to the gate-source voltage $V_{GS+}$, applied across the first FET.

Preferably, the magnitude of the gate-source voltages $V_{GS+}$, $V_{GS-}$ across the first and second FETs are the same, in order to suppress the fundamental mixer frequency, $f_0$. In practice, if the gate-source impedances of the two FETs are not precisely matched, an impedance matching circuit may be provided to equalize the gate-source voltages. In one embodiment, the impedance matching circuit may comprise a shunt capacitor connected between the gate and source of the first or second FET in order to reduce the gate-source impedance and provide adjustment of the gate-source voltages $V_{GS+}$ and $V_{GS-}$. An example of an impedance matching circuit is shown in FIG. 2, in which a shunt capacitor 700 is connected between the gate and source of the first FET 10. The capacitance of the capacitor 700 is preferably chosen to adjust the gate-source voltages so that $|V_{GS+}|=|V_{GS-}|$.

In this way, the local oscillator signal applied to one of the gates of the FETs is arranged to drive gate-source voltages across both FETs of equal magnitude and having a phase difference of 1800 without requiring a signal divider such as a 180° hybrid coupler or balun.

Eliminating the requirement of a 180° hybrid or balun reduces the semi-conductor real-estate required and reduces circuit losses which would otherwise be introduced by the 180° hybrid or balun.

In embodiments of the present invention, the impedance matching circuit may be implemented using any suitable element(s), which still allow the gates of the FETs to be biased as required. In an alternative embodiment, the impedance matching circuit may be implemented using a diode, for example a Shockley diode connected between a gate and source of an FET. An example of an embodiment of a sub-harmonic mixer having an impedance matching circuit implemented by a diode, is shown in FIG. 3.

Figure 3:
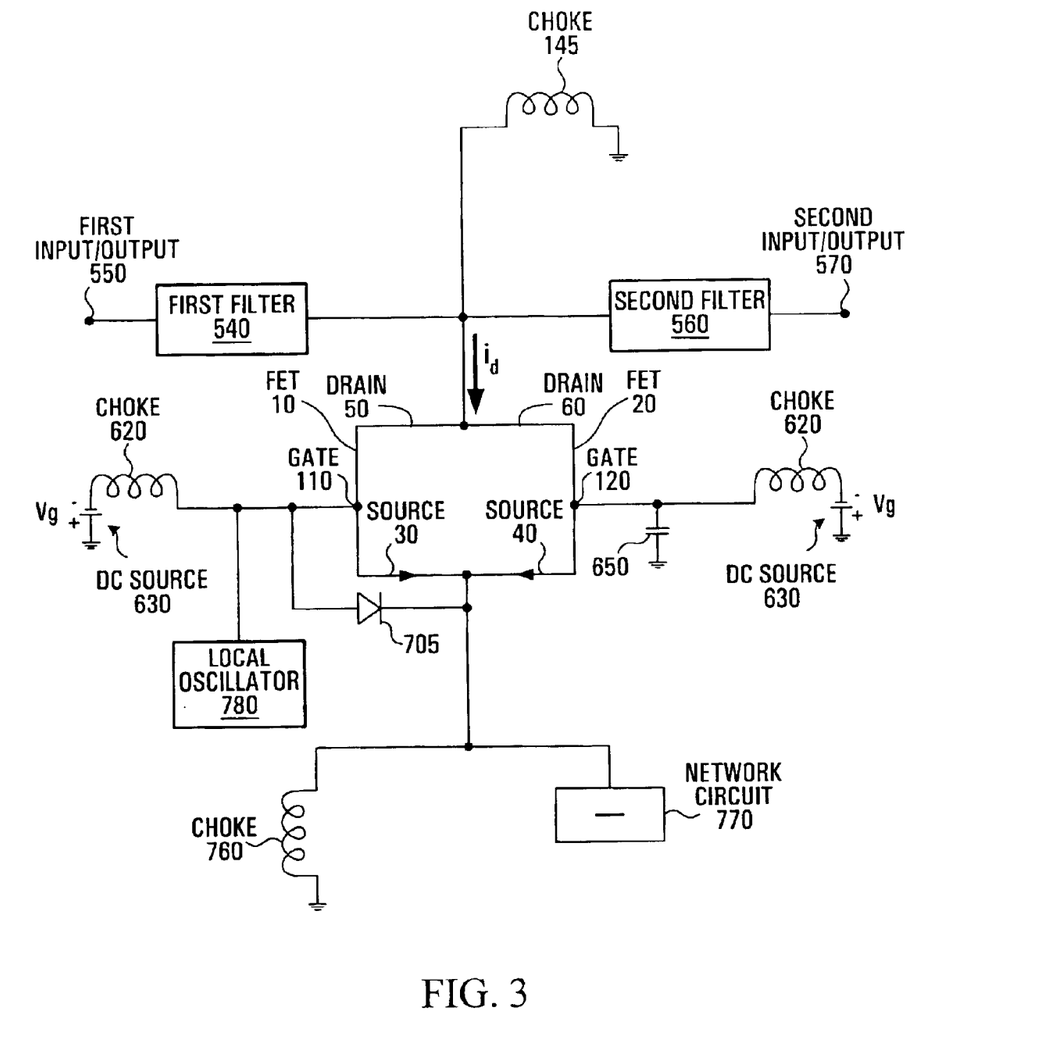
FIG. 3 is a circuit diagram of a sub-harmonic mixer according to another embodiment of the invention.

Referring to FIG. 3, an embodiment of a sub-harmonic mixer is presented which is similar to that shown in FIG. 2, and like parts are designated by the same reference numerals. The main difference between the embodiment of FIG. 3 and that shown in FIG. 2 is that in the embodiment of FIG. 3, the impedance matching circuit is provided by a diode 705 connected between the gate 110 and source 30 of one of the FETs 10. The diode is arranged to maintain a non-conductive state for forward conduction, by, for example reverse biasing the diode, and advantageously, the diode 705 may be arranged to be reversed biased by the DC gate voltage, for example applied by the DC source 630 in FIG. 3. The parasitic capacitance of the diode 705 may provide the desired impedance (or admittance) of the impedance matching circuit. Advantageously, using a diode, for example a Shockley diode, allows the value of (parasitic) capacitance to be controlled with a high degree of accuracy using presently available fabrication techniques.

The gate-source voltages, $V_{GS+}$ and $V_{GS-}$, modulate the source-drain resistances of FETs 10, 20, with frequency, $f_0$. However, as discussed above, $V_{GS+}$ and $V_{GS-}$ have a phase difference of approximately 180° and together FETs 10, 20 provide an effective source-drain resistance which varies with frequency, $2f_0$.

In the case where the input signal is an RF signal of frequency, $f_{IN}=f_{RF}$, the input signal is input at the first input/output 550. The input signal applies a source-drain voltage, $V_{DS}$, having a frequency, $f_{IN}=f_{RF}$, across the sources 30, 40 and drains 50, 60 of the FETs 10, 20. With the effective source-drain resistance of the combined FETS 10, 20 being modulated with frequency, $2f_0$, and the source-drain voltage, $V_{DS}$, having a frequency, $f_{IN}=f_{RF}$, the current, $i_d$, at the drains 50, 60 of the FETs 10, 20 includes frequency components having frequencies of $f_{RF}\pm 2f_0$, and possibly other frequency components, such as $f_{RF}\pm 2nf_0$, where n is an integer >1.

Preferably, the conduction characteristics of the FETS are the same so that the conduction curve of the FET combination is symmetric for both positive and negative cycles of the LO signal, and modulation at the fundamental frequency $f_0$ and higher odd harmonics are suppressed or rejected as much as possible so that the lowest and most dominant modulation frequency is $2f_0$. In one embodiment the frequency component, $f_{RF}-2f_0$ or $2f_0-f_{RF}$, of current $i_d$ may constitute the selected IF frequency to be output from the mixer. The second filter 560 passes this frequency component to the second input/output port 570 while rejecting other frequency components, for example, outside a selected frequency band. In other embodiments, the second filter 560 may be adapted to pass any one or more of the frequency components generated by the mixer, for example, the difference of $f_{RF}$ and a higher even harmonic of $f_0$, e.g. $f_{RF}-4f_0$ or $4f_0-f_{RF}$.

In the case where the input signal is an IF signal of frequency, $f_{IN}=f_{IF}$, the input signal is input at the second input/output 570. The input signal applies a source-drain voltage, $V_{DS}$, having a frequency, $f_{IN}=f_{IF}$, across the sources 30, 40 and drains 50, 60 of the FETs 10, 20. With the effective source-drain resistance of the combined FETs 10, 20 being modulated with frequency, $2f_0$, and the source-drain voltage, $V_{DS}$, having a frequency, $f_{IN}=f_{IF}$, the current, $i_d$, at the drains 50, 60 of the FETs 10, 20 includes frequency components having frequencies, $f_{IF}\pm 2f_0$, and possibly other frequency components, such as $f_{IF}\pm 2nf_0$, where n is an integer >1. In one embodiment, the frequency component of current $i_d$ having a frequency of $f_{IF}+2f_0$ may constitute the selected RF frequency to be output from the mixer. The first filter 540 passes the frequency component of frequency $f_{RF}=f_{IF}+2f_0$ to the first input/output port 550, while rejecting other frequency components, for example, outside a selected frequency band. In other embodiments, the first filter 540 may be used to pass any one or more of the frequency components generated by the mixer, for example, the sum of $f_{IF}$ and a higher even harmonic of $f_0$, e.g. $f_{IF}+4f_0$.

The chokes 620 preferably provide a large impedance at RF and IF frequencies at the gates 110, 120 of the FETs 10, 20 to isolate RF and IF signals from the DC source and its connection to ground. The chokes 620 or at least the choke connected to the LO signal driven gate may also provide a large impedance at frequencies corresponding to the LO signal to isolate the LO signal from a respective DC source 630.

Figure 4:
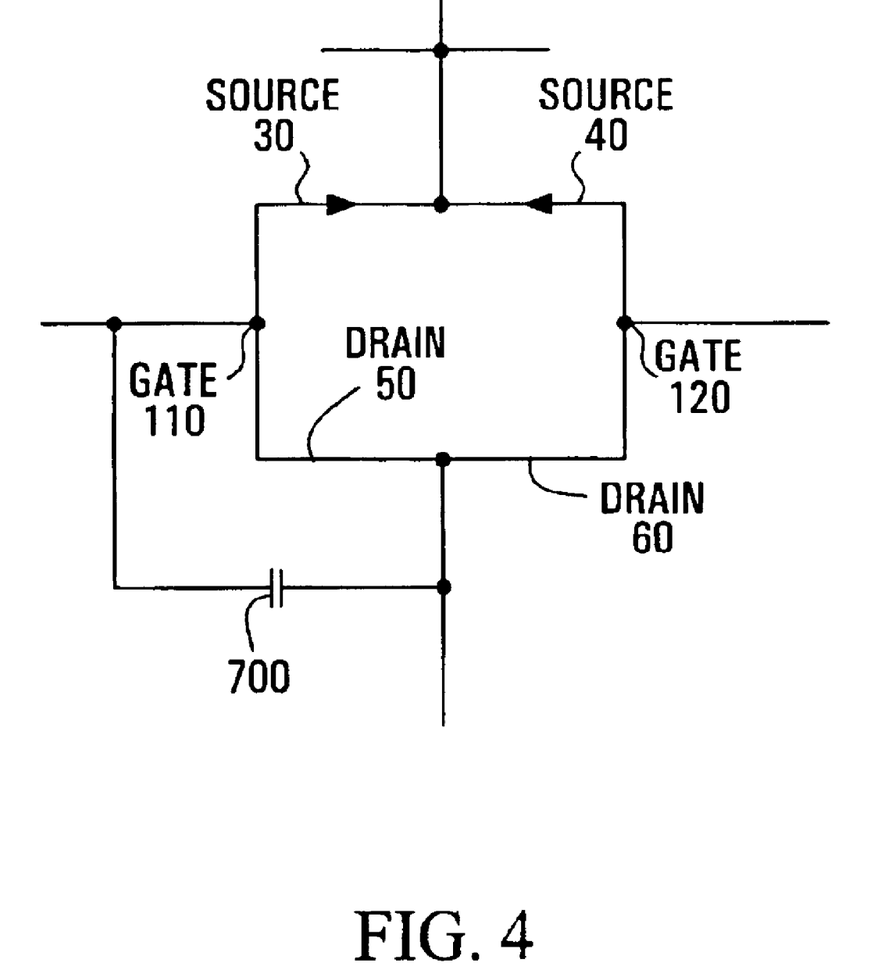
FIG. 4 shows another arrangement of FET's for use in embodiments of the present invention.

In other embodiments of the invention, the sources 30, 40 may be connected to at least one of the filters 540, 560, and the drains 50, 60 may be connected to the impedance matching circuit, e.g. the capacitor 700, or diode 705, to the network circuit 770 and to the choke 760, and an example of this arrangement of FET's is shown in FIG. 4.

Embodiments of the sub-harmonic mixer may be adapted to down-convert RF signals either directly into the baseband signal, or indirectly into an intermediate frequency signal. Similarly, embodiments of the sub-harmonic mixer, may be adapted to up-convert either a baseband signal directly to the desired RF carrier frequency, or to up-convert an intermediate frequency signal to the desired RF carrier frequency.

Embodiments of the mixer may comprise any suitable FETs, including MESFET's (Metal Semiconductor Field Effect Transistor) and HEMT's (High Electron Mobility Transistors), which may include MSFET's fabricated on heterojunction materials, and may be fabricated using MMIC techniques.

Other embodiments of the sub-harmonic mixer may comprise bi-polar transistors, for example heterojunction bi-polar transistors (HBT), rather than FETs. In one embodiment, the mixer comprises first and second bi-polar transistors each having a base, emitter and collector, in which the collectors are both connected together and the emitters are both connected together. A local oscillator may be arranged to drive the base of one of the bi-polar transistors and means may be provided to maintain the potential of the base of the other transistor at a substantially constant value relative to the LO signal applied to other, driven base. The emitters or collectors may be adapted to receive an input signal and either of the collectors or emitters may be adapted to output an output signal (mixer product) generated by the mixer. The mixer may include components and/or circuitry to provide signal isolation at various terminals (or ports) of the bi-polar transistors, as required, and may include one or more similar components or arrangements to those described above in connection with the embodiments of the FET implemented mixers. Examples of such an arrangement may be realised by replacing the FETs in FIGS. 2, 3 and 4 with bi-polar transistors.

In another embodiment of the sub-harmonic mixer, the mixer may have a single, bi-directional input/output port for both receiving an input signal for the mixer and outputting an output signal from the mixer, resulting from mixing between the input and LO signals (e.g. a diplexer implementation). A filter may be coupled between the mixer and the input/output port which is adapted to pass both the input and output signals.

Numerous modifications and variations of embodiments of the present invention are possible in light of the above teachings. It is therefore to be understood that within the scope of the appended claims, embodiments of the invention may be practiced otherwise than as specifically described herein.

What is claimed is:

1. A sub-harmonic mixer comprising:
   first and second field effect transistors (FETs) each having a gate, a source and a drain, the source of the first FET being connected to the source of the second FET and the drain of the first FET being connected to the drain of the second FET;
   input means coupled to said drains for receiving an input signal for the mixer;
   signal generating means for generating a local oscillator (LO) signal and coupled to the gate of one of said first and second FETs, means for maintaining the potential of the gate of the other of said first and second FETs at a substantially constant value relative to the LO signal applied to the gate of said one FET, said FETs being arranged to permit said LO signal applied to the gate of said one FET to drive a voltage across the gate-source of each of said first and second FETs, and
   output means coupled to said drains for outputting an output signal from the mixer.

2. A sub-harmonic mixer as claimed in claim 1, further comprising input signal coupling means for coupling the source of each of said first and second field effect transistors to ground at the frequency of the input signal.

3. A sub-harmonic mixer as claimed in claim 1, further comprising output signal coupling means for coupling the source of each of said first and second field effect transistors to ground at the frequency of the output signal.

4. A sub-harmonic mixer as claimed in claim 1, further comprising DC coupling means for coupling the source of each of said first and second transistors to DC ground.

5. A sub-harmonic mixer as claimed in claim 1, further comprising isolating means for substantially isolating the source of each of said first and second transistors from ground at the frequency of said LO signal.

6. A sub-harmonic mixer as claimed in claim 1, further comprising circuit means coupled between the gate and the source of at least one of the first and second field effect transistor for substantially matching the magnitude of the gate-source voltages applied across the first and second field effect transistors by said LO signal.

7. A sub-harmonic mixer as claimed in claim 6, wherein said circuit means comprises a capacitor for passing a portion of said LO signal between a gate and a source of said at least one field effect transistor.

8. A sub-harmonic mixer as claimed in claim 6, wherein said circuit means comprises a diode for passing a portion of said LO signal between a gate and a source of said at least one field effect transistor.

9. A sub-harmonic mixer as claimed in claim 1, further comprising biasing means for biasing the gate of each of said first and second field effect transistors at a bias voltage such that each of said first and second field effect transistors operate in pinch-off mode.

10. A sub-harmonic mixer as claimed in claim 9, further comprising gate signal filter means for substantially preventing signals having frequencies of any of said local oscillator signal, said input signal and said output signal passing from a respective gate to said biasing means.

11. A sub-harmonic mixer as claimed in claim 10, wherein said gate signal filter means comprises a choke.

12. A sub-harmonic mixer as claimed in claim 1, further comprising DC coupling means for coupling the drains of each of said first and second field effect transistors to DC ground.

13. A sub-harmonic mixer as claimed in claim 12, further comprising filter means for preventing said input signal and said output signal passing through said DC coupling means.

14. A sub-harmonic mixer as claimed in claim 1, wherein said input means comprises an input port and RF filter means connected between said input port and said drains, and adapted to pass signals having frequencies within a frequency band above the frequency of said local oscillator signal.

15. A sub-harmonic mixer as claimed in claim 1, further comprising filter means coupled to the drains of said field effect transistors for passing frequencies within a frequency band below the frequency of said local oscillator signal.

16. A sub-harmonic mixer, comprising:
   first and second FETs (Field Effect Transistors) each having a gate, a drain and a source, the drain of the first FET being connected to the drain of the second FET and the source of the first FET being connected to the source of the second FET;
   input means coupled to one of (1) said sources and (2) said drains for receiving an input signal for the mixer;
   signal generating means for generating a local oscillator signal and coupled to the gate of one of said first and second FETs, means for maintaining the potential of the gate of the other of said first and second FETs at a substantially constant value relative to the local oscillator signal applied to the gate of said one FET, said FETs being arranged to permit said LO signal applied to the gate of said one FET to drive a voltage across (1) the gate-source of each of said first and second FET's, if said input means is connected to said drains and (2) across the gate-drain of each of said first and second FETs, if said input means is connected to said sources, and
   output means coupled to one of (1) said sources and (2) said drains for outputting an output signal from the mixer.

17. A sub-harmonic mixer, comprising first and second bi-polar transistors, each having a base, a collector and an emitter, the collector of the first transistor being connected to the collector of the second transistor and the emitter of the first transistor being connected to the emitter of the second transistor;

input means coupled to one of (1) said collectors and (2) said emitters for receiving an input signal for the mixer;

signal generating means for generating a local oscillator signal and coupled to the base of one of the first and second transistors, means for maintaining the potential of the base of the other of said first and second transistors at a substantially constant value relative to the LO signal applied to the base of said one transistor, said transistors being arranged to permit said LO signal applied to the base of said one transistor to drive a voltage across one of the base-collector and base-emitter of each of the first and second transistors, and output means coupled to one of (1) the collectors and (2) emitters for outputting an output signal from the mixer.

* * * * *